United States Patent [19]

Yamamoto et al.

[11] Patent Number: 4,625,170
[45] Date of Patent: Nov. 25, 1986

[54] NMR IMAGING METHOD AND APPARATUS

[75] Inventors: Etsuji Yamamoto, Hachioji; Shigeru Matsui, Koganei; Masuo Kuroda, Nakano; Hideki Kohno, Suginami, all of Japan

[73] Assignee: Hitachi, Ltd., Tokyo, Japan

[21] Appl. No.: 635,154

[22] Filed: Jul. 27, 1984

[30] Foreign Application Priority Data

Aug. 1, 1983 [JP] Japan .............................. 58-139423

[51] Int. Cl.⁴ ............................................ G01R 33/20
[52] U.S. Cl. .................................... 324/309; 324/307
[58] Field of Search ............... 324/300, 307, 309, 306

[56] References Cited

U.S. PATENT DOCUMENTS

| | | | |
|---|---|---|---|
| 4,297,637 | 3/1982 | Crooks et al. | 324/309 |
| 4,520,315 | 5/1985 | Loeffler | 324/309 |
| 4,532,473 | 7/1985 | Wehrli | 324/306 |

Primary Examiner—Michael J. Tokar
Attorney, Agent, or Firm—Antonelli, Terry & Wands

[57] ABSTRACT

An NMR imaging method and apparatus of the type in which a 180-degree RF pulse is applied to generate a spin echo after the selective excitation of a spin by a 90-degree RF pulse. A dummy gradient field, which has the same direction and intensity as those of a gradient field to be applied when the spin echo is observed, is applied between said 90-degree RF pulse and said 180-degree RF pulse so that the instant of starting the application of the gradient field for signal observation is advanced to the extent corresponding to said dummy gradient field.

5 Claims, 18 Drawing Figures

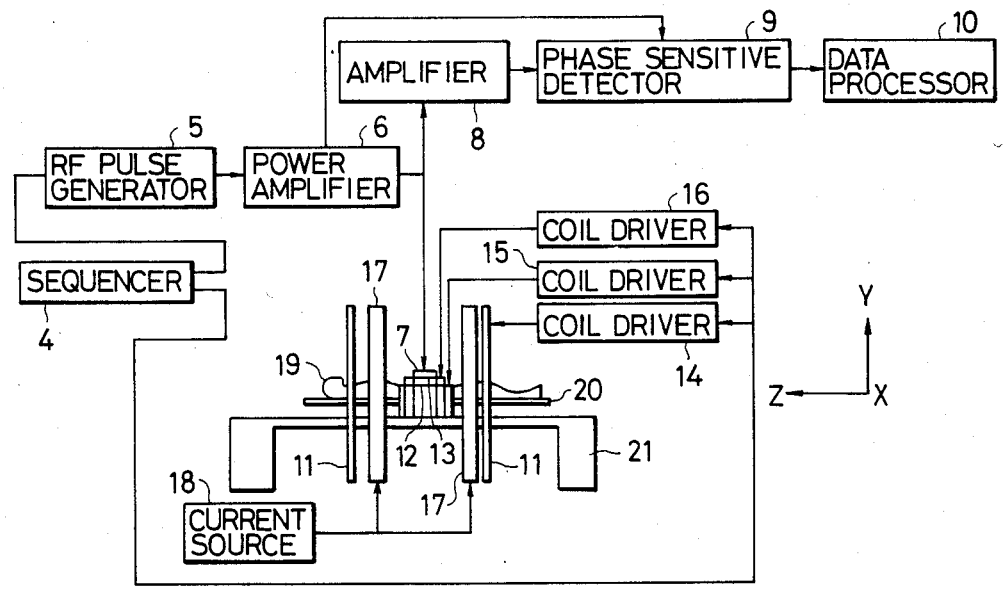
FIG. 1
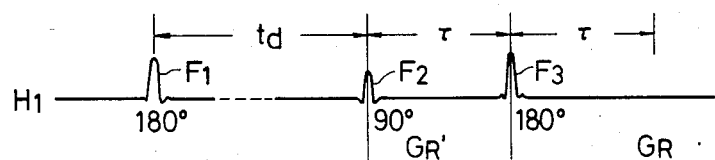
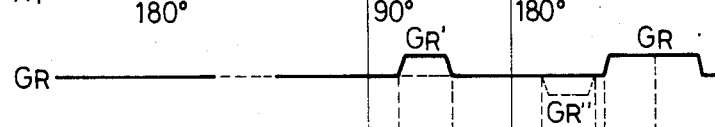
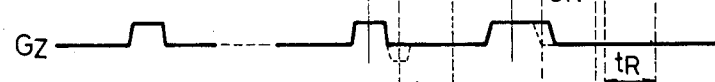
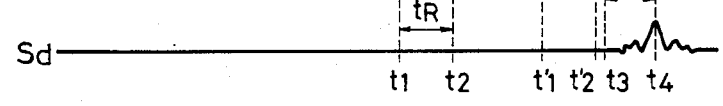

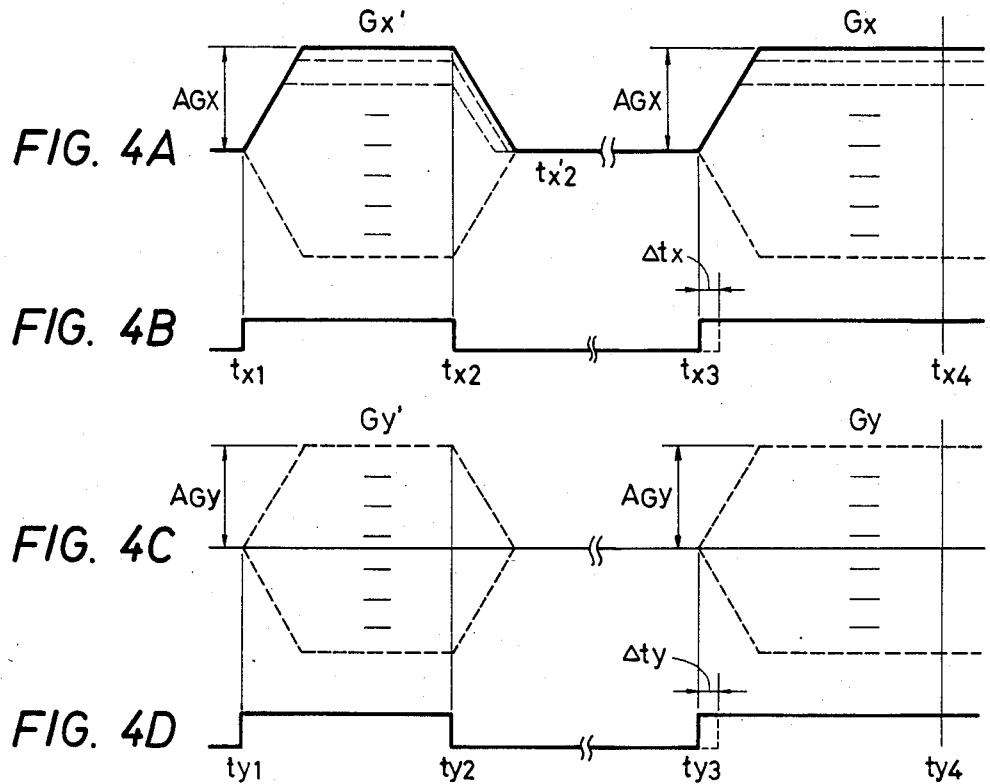

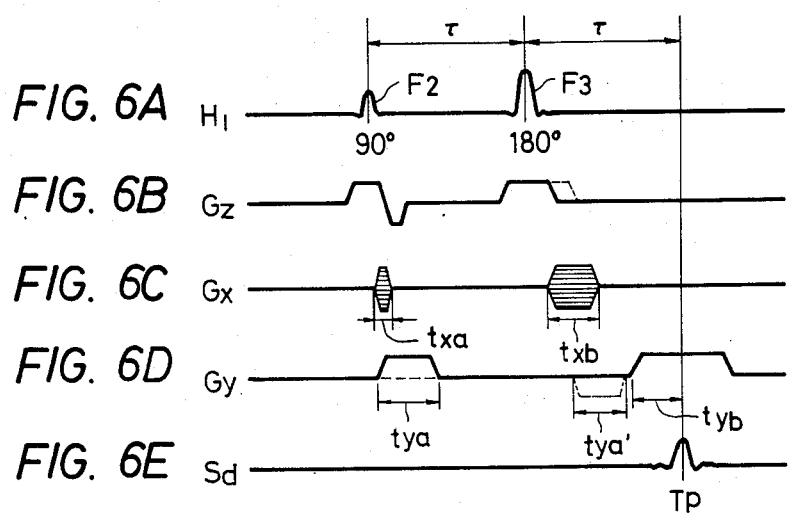
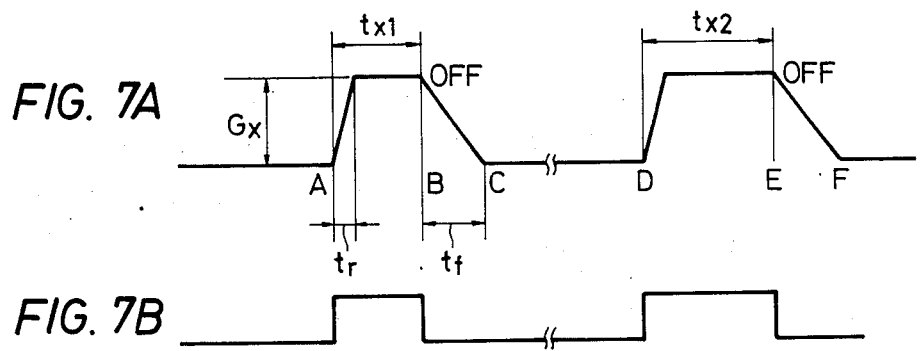

NMR IMAGING METHOD AND APPARATUS

BACKGROUND OF THE INVENTION

The present invention relates to imaging method and apparatus using nuclear magnetic resonance (which will be called the "NMR") and, more particularly, to NMR imaging method and apparatus which can completely correct the distortion of projection data generated due to the rise and fall of a gradient field when a signal is detected.

In the prior art, an X-ray CT or an ultrasonic imaging apparatus is widely used as an apparatus for inspecting or imaging in vivo the internal structure such as the head or abdomen of a human body. It is apparent that trials for making similar inspections by the use of the NMR phenomena have succeeded in recent years to obtain data which cannot be attained by the X-ray CT or the ultrasonic imaging apparatus. In the imaging apparatus using the NMR phenomena, the signal from an object to be imaged has to be separated or recognized in accordance with the position.

One of the methods for the necessity provides the data concerning the position by applying a gradient field in a superposed manner to an object to be imaged which is placed in a uniform static field, to make the field intensity different in accordance with the position thereby to make the resonance frequency different at portions. More specifically, the signals of the individual positions are known by applying a gradient field at an instant when the peak of the NMR signal is produced, by observing the process in which the NMR signal is attenuated by the resultant dephasing, and by knowing the frequency components obtained by the Fourier transformation of the observed signal.

In order to obtain the NMR signal, moreover, there is known a method in which, after the nuclear spins are excited by a 90-degree RF pulse, a 180-degree pulse is applied after lapse of a predetermined time $\tau$ to invert the direction of the nuclear spins thereby to generate an echo. This method has advantages that the signal containing the effect a transverse relaxation time $T_2$ is obtained by setting the time $\tau$, and that the unevenness of the static field is compensated. In this method, since the peak of the echo is produced when the time $\tau$ elapses again from the peak of the 180-degree RF pulse, the gradient field of a desired intensity has to be applied at that instant. In the existing apparatus, incidentally, the gradient field rises at a certain gradient to make it impossible to apply the gradient field of a desired intensity after the above time $\tau$ has accurately elapsed. In the apparatus of the prior art, therefore, the desired spin echo is not generated by the transient phenomena of the rise of the gradient field to cause the image quality to be degraded.

For example, in the image forming method which is called the "projection-reconstruction method" disclosed by C-M Lai and P. C. Lauterber, Jounal of Physics (E), Scientific Instrument Vol. 13, 1980, pp 747–750, the sampling of the NMR signal is repeated by changing the direction of the gradient field for the signal observation thereby to change the direction of projection. The rotations of such gradient field are effected by changing the magnitudes of the two orthogonal gradient field components and by composing those components. As a result, the influences of the transient response at the start and end of application of the gradient field change with the direction of projection, and there exists in the prior art no effective means for correcting the distortion of the resultant projection data.

Moreover, in the imaging method by the direct Fourier imaging method, as is represented by the spin warp imaging method disclosed by W. A. Edelstein et al., Physics in Medicine & Biology 25, pp 751–756, 1980, gradient field pulses having different magnitudes at individual sampling operations for the phase encoding are applied before the application of the gradient field for the signal observation. The transient phenomena of the rise and fall of that gradient field (i.e., the phase encoding gradient field) affects the linearity between the pulse amplitude and the amount of phase encoding. This results in a problem that the image is distorted.

SUMMARY OF THE INVENTION

An object of the present invention is to provide NMR imaging method and apparatus which can completely correct the influences of the transient response of the gradient field.

Another object of the present invention is to provide NMR imaging method and apparatus which can apply a gradient field of a predetermined intensity during a signal observing period to obtain a complete spin echo.

Still another object of the present invention is correct the influences of the transient phenomena of the respective gradient field components of the composed gradient field used in the projection-reconstruction method.

A further object of the present invention is to improve the linearity between the amount of phase encoding used in the direct Fourier imaging method and the amount of encoding of the gradient field thereby to prevent the image distortion.

According to a feature of the present invention, in an NMR imaging method of the type in which a 180-degree RF pulse is applied a predetermined time after application of a 90-degree RF pulse to excite a nuclear spin so that the resultant spin echo may be observed with the gradient field pulse for signal observation being applied, a dummy gradient field pulse in the same direction and of the same amplitude as those of the gradient field pulse for the signal observation is applied for the time period between the applications of the 90-degree RF pulse and 180-degree RF pulse so that the application of the signal observation gradient field pulse is started at an instant retroactive to the instant of production of the peak of the spin echo by the time period corresponding to the application of the dummy gradient field pulse.

According to another feature of the present invention, both the gradient field for the signal observation and the dummy magnetic field are the composed magnetic fields of plural field components, and the instant for starting the generation of the field component pulse for composing the signal observation gradient field is controlled in accordance with the amplitude of the plural field component pulses.

According to still another feature of the present invention, a phase encoding gradient field pulse is applied prior to the application of the signal observation gradient field, and the dummy gradient field pulse having the same direction and amplitude but a different application time as those of the phase encoding gradient field is applied for the time period between the applications of the 90-degree RF pulse and the 180-degree RF pulse.

BRIEF DESCRIPTION OF THE DRAWINGS

FIG. 1 is a block diagram showing the construction of an apparatus according to the embodiment of the present invention;

FIGS. 2A to 2D, FIG. 3, and FIGS. 4A to 4D are time charts and a flow chart showing the pulse sequences of the embodiment of the present invention;

FIGS. 6A to 6E, and FIGS. 7A and 7B are time charts showing the pulse sequences according to another embodiment of the present invention.

DESCRIPTION OF THE PREFERRED EMBODIMENTS

Figure 3:
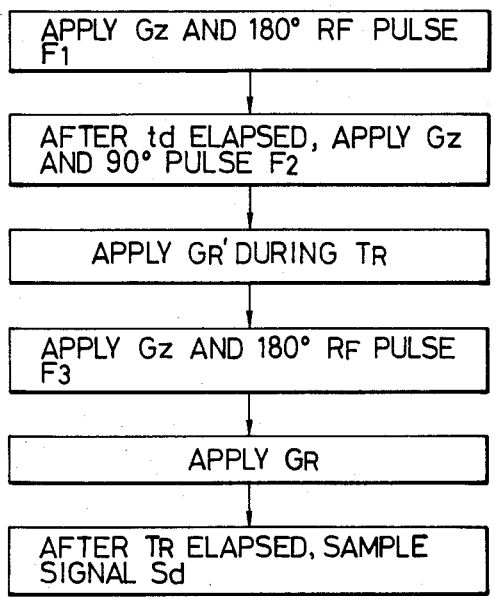

FIG. 1 shows the construction of the imaging apparatus according to one embodiment of the present invention. In FIG. 1: reference numeral 4 indicates a sequencer; numeral 5 an RF pulse generator; and numeral 6 a power amplifier. Indicated at numeral 7 is an RF coil for detecting the signal generated from an object 19 to be imaged simultaneously as an RF magnetic field is generated. Numerals 8, 9 and 10 indicate an amplifier, a phase sensitive detector and a data processor, respectively. Numerals 11, 12 and 13 indicate gradient coils for generating gradient fields in a z direction and in the directions perpendicular to the former, respectively. Numerals 14, 15 and 16 indicate coil drivers for driving the coils 11, 12 and 13, respectively.

The sequencer 4 has a function to output a variety of instructions at a predetermined timing to the individual units, and the pulse sequences of the present invention to be described hereinafter are stored in the ROM of the sequencer 4. The output of the RF pulse generator 5 is amplified by the power amplifier 6 to excite the RF coil 7. This coil 7 also acts as the receiving coil, as has been described above, so that the signal components received pass through the amplifier 8 and are detected by the phase-sensitive detector 9 until they are transformed into an image by the action of the data processor 10.

Incidentally, the generation of a static field is effected by the action of a coil 17 which is driven by a current source 18. The human body 19, i.e., the object to be imaged is placed on a bed 20, which is carried on a carriage 21.

FIGS. 2A to 2D show the pulse sequences to be used in the present embodiment. These pulse sequences are those for executing the projection-reconstruction method. FIG. 2A shows an RF magnetic field $H_1$; FIG. 2B shows a rotating gradient field $G_r$ having a gradient perpendicular to the z direction; FIG. 2C shows a gradient field $G_z$ in the z direction; and FIG. 2D shows an echo signal $S_d$ to be detected.

First of all, the z-direction gradient field $G_z$ is applied, and a 180-degree RF field pulse $F_1$ is excited 0.3 to 1 msec later to invert the magnetization in a predetermined slice. This magnetization is necessary for incorporating the data of longitudinal relaxation time into the signal by the inversion-recovery method but can be omitted in the spin density imaging case. After the excitation of the 180-degree RF field pulse $F_1$, the gradient field $G_z$ is applied again, and a 90-degree pulse $F_2$ is excited 0.3 to 1 msec later. At this time, the time interval between the 180-degree and 90-degree pulses $F_1$ and $F_2$ is set at $t_d$. As a result, the magnetization in the slice is rotated by 90 degrees so that the signal may be detected.

There is a method in which the phase error of the nuclear spin is caused during the excitation of the magnetic field so as to continue the 90-degree RF field pulse $F_2$ or the 180-degree RF field pulse $F_1$ for about 1 to 10 msecs and in which the gradient field is inverted so as to compensate the phase error. According to this method, however, the phase error based upon the unevenness of the static field cannot be compensated.

In the present embodiment, therefore, the magnetization is inverted by a 180-degree RF field pulse $F_3$ to restore the phase error so that the influences of the unevenness of the static field are compensated.

Incidentally, after the compensation of the phase error in the z direction, as will be described hereinafter, the correct projection data cannot be obtained even if the signal is sampled immediately after application of the gradient field pulse $G_R$. This is because of the influences of the delay in the rise of the gradient field pulse $G_R$. In the present embodiment, therefore, not only the magnetization is inverted by the 180-degree RF field pulse $F_3$ but also a dummy gradient field pulse $G_R'$ is applied between the 90-degree RF field pulse $F_2$ and the 180-degree RF field pulse $F_3$, as has been described hereinbefore. The echo signal is made to take its peak at an instant when the following condition is satisfied:

$$\int_{t_1}^{t_2} G_R' \, dt - \int_{t_3}^{t_4} G_R \, dt = 0 \tag{1}$$

Here, the letters $t_1$, $t_2$ and $t_3$ in the above equation are so selected that the peak of the echo signal is produced after lapse of the time $\tau$ from the 180-degree RF field pulse $F_3$ when the interval between the peaks of the 90-degree RF field pulse $F_2$ and the 180-degree RF field pulse $F_3$ is denoted by the letter $\tau$. If the following inequality holds, the echo signal can be detected from the instant when the transient phenomena of the gradient field pulse $G_R$ completely disappear, so that the correct projection data can be restored:

$$t_4 - t_3 > 0.3 \text{ msec} \tag{2}$$

As in the above, moreover, the phase error based upon the unevenness of the static field can be compensated by making substantially equal the interval between the 90-degree RF field pulse $F_2$ and the 180-degree RF field pulse $F_3$ and the interval from the 180-degree RF field pulse $F_3$ to the peak of the echo signal.

According to the present embodiment, still moreover, the relationships of the equations (1) and (2) can be easily satisfied merely by controls at the instants of starting and ending the pulse applications with the use of the common coil driver by making the field pulses $G_R$ and $G_R'$ take the same direction and the same amplitude so that the correct projection data can be obtained. The procedures thus far described are tabulated into the form of FIG. 3. These series sequences are repeated a plurality of times with the gradients of the pulses $G_R$ and $G_R'$ being varied, and the resultant projection data are reconstructed by the action of the data processor 10 thereby to provide the sectional image of the object.

Incidentally, the reason for applying the gradient fields $G_R$ and $G_Z$ 0.3 to 1 msec before the instant of exciting the first 90- or 180-degree RF field pulse is effected to prevent the slice from being distorted by those transient phenomena. On the other hand, since the echo signal taking its peak at time $t_4$ is symmetric, it may be folded at the peak to sum up the two. This results in the effect that the S/N ratio of the echo signal is raised to a value of $\sqrt{2}$ times. Alternatively, the projection data or image may be prepared from the right and left echo signals and superposed one on the other. Or, the echo signals as a whole may be subjected to the direct Fourier transform operation. In this case, the time period of $t_2-t_1$ has to be so selected that the time period of $t_4-t_3$ may be longer than the summed period of that for the signal generation and the transient period of the gradient field $G_R$. More specifically, if the sampling period of the signal is designated by $\Delta t$ and the total sampling number is designated by $2N$, the following inequality has to hold:

$$t_4 - t_3 > \Delta t \cdot N + 0.3 \text{ msec} \tag{3}$$

Incidentally, in place of the dummy gradient field pulse $G_R'$ in the same direction as the pulse $G_R$, as shown by a broken line in FIG. 2B, the same effect as that obtained upon application of the pulse $G_R'$ can be achieved by applying a dummy gradient field pulse $G_R''$ in the direction opposite to that of the pulse $G_R$ for the time period of $t_1'$ to $t_2''$ after the application of the 180-degree pulse $F_3$.

The description thus far made is directed mainly to the restoration of the phase error which is caused as a result of application of the gradient field $G_R$. For the gradient field $G_Z$, the phase error resulting from the application thereof has to be restored before the instant of occurrence of the peak of the echo signal. The condition therefor is that the integrated value of the gradient field $G_Z$ applied from the center of the 90-degree RF field pulse $F_2$ to the center of the 180-degree RF field pulse $F_3$ be equal to that of the gradient field $G_Z$ applied from the center of the 180-degree RF field pulse $F_3$ to the center of the echo signal. This is realized in the sequence of FIG. 2C by elongating the time period for the application of the field $G_Z$ after the 180-degree pulse $F_3$. The above condition can be realized not only by the above method but also by the method in which the pulse $G_Z$ is inverted after the application of the pulse $G_Z$ for the selective excitation together with the 90-degree pulse $F_2$, as shown by broken lines in FIG. 2C.

In the sequences shown in FIGS. 2A to 2D, moreover, the gradient field $G_Z$ is applied at all times when the 90-degree or 180-degree RF field pulse is excited. In short, the selective exciting pulse is applied. This is not a treatment for preventing the magnetization outside the slice from being affected and need not be applied at all times for other than the 90-degree RF field pulse $F_2$. In the case, the 180-degree RF field pulse may be applied an even number times to return the magnetization outside of the slice to its original state.

Moreover, if another 180-degree RF magnetic field is applied in a superposed manner to the gradient field $G_Z$ after the stopping of the application of the gradient field $G_R$ and if the gradient field $G_R$ is applied after the stopping of the application of said gradient field $G_Z$, the echo signal can be sampled again. The signal obtainable at this time is one which is attenuated by the transverse relaxation time so that the signals in which the effects of the transverse relaxation time are varied are generated by changing the interval between the two 180-degree RF magnetic fields. In case the effect of the transverse relaxation time can be ignored, as has been described above, the S/N ratio can be improved by the superposition on the first signal. By the similar procedures, the echo signals can be sampled sequentially.

In the explanations of FIGS. 2A to 2D, the gradient field $G_R$ is set to have a constant intensity. actual apparatus, incidentally, in order to effect the imaging operation by the projection-reconstruction methods, the gradient fields are generated by the coils having wirings in two orthogonal directions, such as the gradient coils 12 and 13 of FIG. 1, respectively, so that the rotating gradient field $G_R$ is obtained by the composition. As a result, the gradient field component $G_x$ by the coil 12 and the gradient field component $G_y$ by the coil 13 must have their magnitudes sequentially varied. Therefore, the application timings of the individual gradient field components have to be specially controlled. This will be described in the following.

In FIG. 4A, letter $G_x'$ indicates a gradient field pulse in the x direction for generating the dummy magnetic field $G_R'$ of FIG. 2B. On the other hand, letter $G_x$ indicates a gradient field pulse in the x direction for generating the magnetic field $G_R$. Solid lines designate representative pulse shapes, but in fact the amplitudes of the fields $G_x$ and $G_x'$ have to be changed, as indicated by broken lines, in accordance with the polarities of the fields $G_R$ and $G_R'$. On the other hand, FIG. 4B shows the control signal for controlling the start and stop of the field pulses for generating the fields $G_x$ and $G_x'$, and letters $t_{x1}$, $t_{x2}$ and $t_{x3}$ indicate the instants for starting and stopping application of field $G_x'$ and for starting application of the field $G_x$.

Now the instant when the transient response at the stopping of the field $G_x'$ is completely finished is designated at $t_{x2}'$ and the instant when the echo peak is produced is designated at $t_{x4}$, the following equation has to be satisfied so that the phase error by the application of the gradient field in the x direction may be completely eliminated at the instant $t_{x4}$:

$$\int_{t_{x1}}^{t_{x2}} G_x' \, dt - \int_{t_{x3}}^{t_{x4}} G_x \, dt = 0 \tag{4}$$

Here, if the amplitudes of the magnetic fields $G_x'$ and $G_x$ are designated at $A_{Gx}$, if the absolute value (or the slope) of the changing rate of the intensity of the magnetic field at the start of those magnetic fields is designated at $K_1$, and if the slope rate at the end of the application is designated at $K_2$, the equation (4) is expressed in the following form:

$$(t_{x2} - t_{x1})A_{Gx} - \frac{1}{2}\left(\frac{1}{K_1} - \frac{1}{K_2}\right)A_{Gx}^2 - \left[(t_{x4} - t_{x3})A_{Gx} - \frac{1}{2K_1}A_{Gx}^2\right] = 0 \tag{5}$$

Hence, $$t_{x4} - t_{x3} = (t_{x2} - t_{x1}) + \frac{1}{2K_2}A_{gx} \tag{6}$$

Here, the instant $t_{x4}$ is determined by the applications of the 90-degree pulse $F_2$ and the 180-degree pulse $F_3$. In order to satisfy the equation (6), therefore, either the instant $t_{x3}$ of starting the application of the field $G_x$ or the period $(t_{x2}-t_{x1})$ of the dummy gradient field $G_x'$ has to be varied in accordance with the amplitude $A_{Gx}$.

The above discussion is absolutely identically applied to the y-direction gradient field components $G_y$ and $G_y''$, which are applied from the coil 13 at a right angle with respect to the magnetic fields $G_x$ and $G_x'$, so that either the instant $t_{y3}$ of starting the application of the magnetic field $G_y$ shown in FIG. 4D or the time period $(t_{y2}-t_{y1})$ of the dummy gradient field $G_y'$ has to be varied in accordance with the amplitude $A_{Gy}$ of the pulses $G_y$ and $G_y'$ shown in FIG. 4C.

According to the present embodiment, this is realized by setting the reference instants $t_{x3}$ and $t_{y3}$, and by delaying those instants by $\Delta t_x$ and $\Delta t_y$, respectively.

Figure 5:
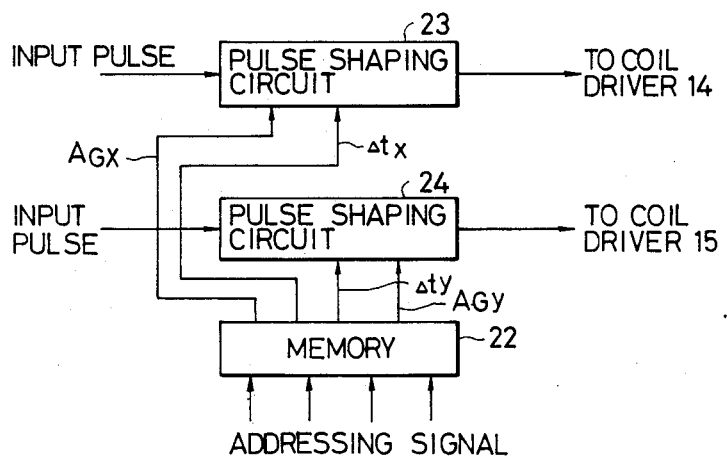
FIG. 5 is a block diagram showing such a portion of the same embodiment as effects the application timing control of the gradient fields of the same embodiment.

FIG. 5 shows the construction of the portion of the sequencer 4 for executing the function described above. In FIG. 5, numeral 22 indicates a memory (e.g., ROM or RAM) for storing the above values $\Delta t_x$ and $\Delta t_y$ according to the projection angle, and numerals 23 and 24 indicate pulse shaping circuits. The values $\Delta t_x$ and $\Delta t_y$ stored in the memory 22 are those which are computed by the equation (6) or measured, and correspond to the amplitudes of the gradient magnetic fields in the x and y directions.

From the memory 22, there are read out the corresponding values $\Delta t_x$ and $\Delta t_y$ by the assignment of the address signals which correspond to the projection angle. In the pulse shaping circuit 23, in accordance with the value $\Delta t_x$ read out, the drop of the second pulse of the reference pulse sequence indicated by the solid lines in FIG. 4B is so delayed as is indicated by broken lines in FIG. 4B, and the pulse amplitude is controlled to the value $A_{Gx}$ which is assigned to correspond to the projection angle. The coil driver 14 amplifies the power of the controlled pulse to drive the coil 12. In the pulse shaping circuit 24, on the other hand, the phase of the reference pulse sequence shown by the solid lines in FIG. 4D is so delayed in accordance with the value $\Delta t_y$ as is shown by the broken line in the same Figure so that the amplitude is controlled to the assigned value $A_{Gy}$. The coil driver 15 amplifies the power of the controlled pulse to drive the coil 13.

By the controls thus far described, for the individual gradient field components forming the rotating gradient field, the integrated value between the peaks of the 90-degree pulse $F_2$ and the 180-degree pulse $F_3$ and the integrated value between the peaks of the 180-degree pulse $F_3$ and the echo signal become identical, and the phase error resulting from the applications of the individual gradient field components is eliminated so that the desired spin echo can be attained.

In order to attain sectional images in different directions, the rotating gradient field has to use not only the gradient field components in the x and y directions but also the gradient field component in the z direction. As a result, the apparatus is equipped with three systems of the pulse shaping circuits shown in FIG. 5 so that the instant of starting application of the gradient field $G_{RZ}$ in the z direction must be able to be controlled in accordance with the projection angle.

In the description described above, on the other hand, it is assumed that the peaks of the signals always take place at Lhe same time. This condition need not hold at all times. It is important that the integrated values of the gradient fields applied in the individual x, y and z directions be substantially zero as a whole at a time for each projection, because it is allowable that the time may be slightly different for each projection. This allowability is thought to be acceptable if it is sufficiently shorter than the transverse relaxation time of the object and the attenuation time due to the unevenness of the static field from the standpoint of practice. In this case, moreover, the processing has to be made such that the instant of occurrence of the peak of the signal shifts in accordance with the projection. This shift or discrepancy can be computed by the use of the foregoing equation (4), for example, so that it can be easily corrected.

In dependence upon the apparatus, incidentally, the slopes $K_1$ and $K_2$ may not be constant but depend upon the amplitude of the gradient field pulse. Even in this case, too, the pulse sequences can be shaped by computing or sampling the value $\Delta t_x$ and $\Delta t_y$ in a manner to satisfy the above condition, e.g., the foregoing equation (4). By making the slopes $K_1$ and $K_2$ variable in accordance with the amplitude of the gradient field pulse, on the contrary, the instants of producing the peak of the signal can be made uniform.

The description thus far made has been directed to the projection-reconstruction method. Despite of this fact, the present invention should not be limited thereto but can be applied widely to all the imaging methods for generating echo signals by using the gradient field.

Another embodiment using the Fourier imaging method will be described in the following.

In the Fourier imaging method, as is different from the projection-reconstruction method, the application of the gradient field is conducted in two divided time bands. One of them is the section for applying a phase encoding gradient field, whereas the other is the section for applying a gradient field for signal observation in a direction perpendicular to the former. If, in the first section, the phase encoding magnetic field $G_x$ is applied for the time $t_x$, the phase encoding of $$\int_0^{t_x} \gamma G_x x \, dt$$

is caused in the x direction. Here, the letter $\gamma$ denotes the gyromagnetic ratio, and the letter x denotes the x coordinate in which the nuclear spin is located. In the next section, if the signal is observed with the application of the gradient field $G_y$ generally perpendicular to the magnetic field $G_x$, it is possible to attain the projection perpendicular to the magnetic field $G_y$. The observations described above are repeated by varying the instant $t_x$ or the magnetic field $G_x$. As a result, the series projection signals are subjected to the two-dimensional Fourier transformation so that a two-dimensional image of the nuclear spins of the section of the object can be obtained. The importance of this method resides in that the amount of phase encoding has to be changed at an equal rate during the repetitions of the above observations.

FIGS. 6A to 6E are time charts showing the sequences of the embodiment of the present invention by the Fourier imaging method. FIG. 6A shows an RF magnetic field $H_1$; FIG. 6B shows the gradient field $G_z$ in the z direction; FIG. 6C shows the gradient field $G_x$ in the x direction of the phase encoding; FIG. 6D shows the gradient field $G_y$ in the y direction for signal observation; and FIG. 6E shows the echo signal $S_d$ observed. The present embodiment is directed to the case in which the pulse amplitude of the gradient field $G_x$ is changed upon each repetition of the observations.

First of all, the gradient field $G_z$ is applied to excite the magnetization of a predetermined slice of the object by the 90-degree RF pulse $F_2$. Like the foregoing embodiment shown in FIGS. 2A to 2D, incidentally, the magnetization is inverted by the 180-degree RF pulse so that the effect of the longitudinal relaxation time may be incorporated into the signal. After lapse of the $\tau$ time from the application of the 90-degree RF pulse $F_2$, the 180-degree RF pulse $F_3$ is applied again together with the magnetic field $G_x$ to generate the spin echo. Incidentally, the reason why the magnetic field $G_z$ is inverted after the application of the 90-degree RF pulse $F_2$ is to compensate the phase error of the spin, which is caused by the application of the magnetic field $G_z$. In place of this method, as shown by broken lines in FIG. 6B, a magnetic field $G_z$ for compensation may be applied after the 180-degree RF pulse $F_3$. Alternatively, the magnetic field $G_z$ is not applied at the time of applying the pulse $F_3$, but the magnetization of the object as a whole may be inverted. Moreover, the pulse $F_3$ may be an RF pulse having a square shape. As shown in FIG. 6C, the phase encoding gradient field $G_x$ is applied for a period $t_{xa}$ between the 90-degree pulse $F_2$ and 180-degree pulse $F_3$ and for a period $t_{xb}$ between the 180-degree pulse $F_3$ and the peak of the signal. Thus, the former can be deemed as a dummy gradient field. As a result, the effects of the gradient field pulses applied at both the sides of the 180-degree pulse act to offset each other so that the effective amount $\theta$ of phase encoding is given by the following equation:

$$\theta = \gamma \int_0^{t_{xb}} G_x \, dt - \gamma \int_0^{t_{xa}} G_x \, dt.$$

FIG. 7A shows such a phase encoding gradient field pulse $G_x$ in an enlarged scale as has a predetermined amplitude $A_{Gx}$. Since the rising and falling times of the gradient field are not generally identical, their respective slopes are designated at $K_r$ and $K_f$. If the rising time and the falling time are designated at $t_r$ and $t_f$, respectively, the following equations hold:

$$K_r = \frac{A_{Gx}}{t_r}; \text{ and } K_f = \frac{A_{Gx}}{t_f} \qquad (7)$$

Here, the section A–C is located between the 90-degree and 180-degree pulses, and the section D–F is located between the 90-degree pulse and the peak of the signal. On the other hand, the instruction signal for instructing the start and stopping of the application of the gradient field is formed, as shown in FIG. 7B, into such a square shape that it is turned on at the instants A and D and off at the instants B and E. At this time, the amount of phase encoding $\theta_1$ in the section A–C is given by the following equation:

$$\theta_1 = \tfrac{1}{2} A_{Gx}^2 \left( \frac{1}{K_f} - \frac{1}{K_r} \right) + t_{x1} A_{Gx} \qquad (8)$$

Likewise, the amount of phase encoding $\theta_2$ in the section D–F is given by the following equation:

$$\theta_2 = \tfrac{1}{2} A_{Gx}^2 \left( \frac{1}{K_f} - \frac{1}{K_r} \right) + t_{x2} A_{Gx} \qquad (9)$$

Hence, the effective amount of phase encoding $\theta$ is given by the following equation:

$$\theta = \theta_2 - \theta_1 = (t_{x2} - t_{x1}) A_{Gx} \qquad (10)$$

It is understood from the above equation that the effective amount $\theta$ is proportional to the amplitude $A_{Gx}$ of the field pulse $G_x$ for the constants $t_{x2}$ and $t_{x1}$. It is also understood that the amount of phase encoding $\theta$ is proportional to the value $A_{Gx}$ but is not dependent upon the slopes $K_r$ and $K_f$ in the least. This is the effect of applying the dummy field pulse in the phase encoding gradient field. If it were not for the dummy field pulse, the amount of phase encoding $\theta$ is expressed by the equation (9) and is not proportional to the value $A_{Gx}$ except the case of $K_f = K_r$. Then, complicated controls are required by varying the period $t_{x2}$ in accordance with the value $A_{Gx}$ or by varying the value $A_{Gx}$ so that the change of the amount $\theta$ may be identical for the constant period $t_x2$.

In the description made above, the inequality of $\theta_2 > \theta_1$ is assumed. However, this effect is not unchanged in the least for $\theta_2 > \theta$. In the latter case, it can be thought that the magnetic field deemed as the dummy field pulse in the field pulse $G_x$ and the phase encoding magnetic field are interchanged.

In the example described above, incidentally, the transient response region of the gradient field is deemed as a straight line. The effect of the dummy magnetic field should not be limited thereto, but the transient response region may taken an arbitrary shape. This is because the difference between the dummy magnetic field and the subsequent magnetic field contributes to the effective phase encoding so that the transient response region is offset by the two.

Next, the application sequence of the gradient field $G_y$ for signal observation, as shown in FIG. 6D, will be described in the following. Prior to the application of the 180-degree pulse $F_3$ for generating a spin echo in the signal $S_d$ shown in FIG. 6E, the dummy gradient field pulse having the same amplitude as that of the gradient field pulse for the signal observation is applied for a time period $t_{ya}$. As a result, the start of applying the gradient field pulse for the signal observation can be advanced by $t_{yb}$ from the instant $T_p$ when the peak of the echo signal is produced. More specifically, the dummy gradient field pulse applied for the period $t_{ya}$ has the same effect as that of the dummy gradient field pulse $G_R'$, as has been described with reference to FIG. 2B, to make it possible to sample the signal $S_d$ under the gradient field of a predetermined intensity after the transient response is finished. Since the two sides of the echo signal are frequently sampled in the usual operation, it is necessary to set the period $t_{ya}$ so that the period $t_{by}$ may become longer than the sum of the half of the sampling period and the period of the transient response.

Incidentally, as shown in FIG. 6D, a similar effect can be attained even if an inverse dummy field pulse is applied for the period $t_{ya}'$ of applying the 180-degree pulse, without any application of the dummy field pulse for the period $t_{ya}$ prior to the application of the 180-degree pulse $F_3$.

In the embodiment having been described with reference to FIGS. 6A to 6E and FIGS. 7A and 7B, the amplitude of the phase encoding gradient field $G_x$ is varied. In place of this, the amount of phase encoding may be varied even if the period $t_{x2}$ of FIG. 7B is varied. The sequences to be used in this case is identical to those shown in FIG. 6. In place of the amplitude $A_{Gx}$, the application width of the magnetic field $G_x$ to be applied during the period $t_{xb}$ is varied. Since the equation (10) holds in this case, too, it is understood that the amount of phase encoding $\theta$ is proportional to the difference of $t_{x2} - t_{x1}$. In this phase encoding method, the improvement in the linearity in the amount of phase encoding due to the dummy gradient field pulse applied for the period $t_{xa}$ is more prominent than the foregoing method in which the amplitude $A_{Gx}$ is varied. In case the dummy gradient field pulse is not applied, more specifically, the amount of phase encoding is determined by the equation (9) so that the first term of the righthand side, i.e., $$\tfrac{1}{2} A_{Gx}^2 \left( \frac{1}{K_f} - \frac{1}{K_r} \right)$$

gives the error of the amount of phase encoding. The value of this error is obtained because it occupies a large rate in the amount of phase encoding especially in the region where the value $t_{x2}$ is far smaller than the values $t_r$ and $t_f$ so that the error is offset by the application of the dummy field pulse.

Incidentally, in the foregoing embodiments, the signal is observed while the gradient field pulse $G_y$ is being applied. In a chemical shift imaging method, for example, the echo signal is not observed before a predetermined time elapses after the end of application of the pulse $G_y$. In this case, the gradient field $G_y$ in the y direction is varied for each sampling like the gradient field $G_x$ shown in FIG. 6C. For this gradient field in the y direction, too, the linearity of the amount of phase encoding can be improved by applying the dummy gradient field pulse before the 180-degree pulse is applied.

What is claimed is:

1. An NMR imaging method comprising:
   the step of applying a first RF field pulse for exciting the magnetization of an object to be imaged, which is placed in a predetermined magnetic field;
   the step of applying a second RF field pulse for generating a spin echo;
   the step of applying a first gradient field pulse having an integrated value effectively proportional to the amount of phase encoding of a signal detected including dividing said first gradient field pulse into a first portion to be applied before said second RF field pulse and a second portion to be applied after said second RF field pulse, said first and second portions having an equal amplitude, and controlling the amount of phase encoding by changing the amplitude of said first gradient field pulse; and
   the step of applying a second gradient field pulse having a gradient in a direction from that of said first gradient field pulse together with the spin echo which is generated by the application of said second RF field pulse.

2. An NMR imaging method according to claim 1, further comprising the step of applying a dummy gradient field in the same direction and of the same amplitude as those of said second gradient field pulse for the time period between said first RF field pulse and said second RF field pulse.

3. An NMR imaging method comprising plural time repetitions of a pulse sequence, the pulse sequence including:
   applying a first RF field pulse for exciting nuclear spins of an object to be imaged, which is placed in a predetermined magnetic field;
   applying a second RF field pulse for generating a spin echo;
   applying phase encoding gradient field pulses to produce a field gradient along a first axis, the step of applying phase encoding gradient field pulses including applying a first phase encoding gradient field pulse during a time interval between said first and second RF field pulses and applying a second phase encoding gradient field pulse during a time interval between said second RF field pulse and said spin echo, said first and second phase encoding gradient field pulses having the same amplitude and a different pulse-width so that a phase of spins are encoded along said first axis;
   applying a reading gradient field pulse to produce a field gradient along a second axis which is perpendicular to said first axis; and
   changing the amplitude of said first and second phase encoding gradient field pulses by the same amplitude amount each successive repetition time so that the amount of phase encoding caused by said first and second phase encoding gradient field pulses is successively changed.

4. An NMR imaging apparatus comprising:
   means for producing a static field in a space in which an object to be imaged is placed;
   means for applying an RF magnetic field;
   a plurality of gradient field generating means for applying gradient fields having different gradient directions;
   means for detecting an NMR signal from said object; and
   control means for controlling said RF field generating means and said gradient field generating means in accordance with a pulse sequence, said control means including means for controlling application of a first RF field pulse for exciting nuclear spins of the object to be imaged, means for controlling application of a second RF field pulse for generating a spin echo, means for controlling application of phase encoding gradient field pulses to produce a field gradient along a first axis including application of a first phase encoding gradient field pulse during a tim interval between said first and second RF field pulses and application of a second phase encoding gradient field pulse during a time interval between said second RF field pulse and said spin echo, said means for controlling application of said first and second phase encoding gradient field pulses controlling the amplitude thereof to be equal and controlling the amount of phase encoding by chaging the amplitude of said first and second phase encoding gradient field pulses while maintaining the amplitude thereof equal so that the phase of spins are encoded along said first axis, said control means applying a reading gradient field pulse to produce a field gradient along a second axis which is perpendicular to said first axis; and
   said means for detecting an NMR signal detecting the spin echo which is generated by the application of said second RF field pulse during said reading gradient field pulse.

5. An NMR imaging apparatus according to claim 4, wherein said control means provides for plural time repetitions of the application of said pulse sequence and changes the amplitude of said first and second phase encoding gradient field pulses by the same amplitude amount each successive repetition time so that the amount of phase encoding caused by said first and second phase encoding gradient field pulses is successively changed.

* * * * *